United States Patent
Lin et al.

(10) Patent No.: US 9,720,320 B2
(45) Date of Patent: Aug. 1, 2017

(54) OPTICAL SHEET, METHOD FOR MANUFACTURING THE SAME, LIGHT EMITTING DIODES MODULE AND DISPLAY USING THE SAME

(71) Applicant: National Chiao Tung University, Hsinchu (TW)

(72) Inventors: Chien-Chung Lin, Taipei (TW); Hao-Chung Kuo, Zhubei (TW); Kuo-Ju Chen, Taichung (TW); Hau-Vei Han, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/943,100

(22) Filed: Nov. 17, 2015

(65) Prior Publication Data
US 2016/0369953 A1    Dec. 22, 2016

(30) Foreign Application Priority Data

Jun. 18, 2015    (TW) .............................. 104119753 A (51) Int. Cl.
*G03F 7/00*    (2006.01)
*G02B 5/18*    (2006.01)
*B82Y 20/00*   (2011.01)

(52) U.S. Cl.
CPC ............ *G03F 7/0035* (2013.01); *B82Y 20/00* (2013.01); *G02B 5/1861* (2013.01); *G03F 7/0005* (2013.01)

(58) Field of Classification Search
CPC . F21K 9/56; F21K 9/90; G03F 7/0005; G03F 7/0035; G02B 5/1861
See application file for complete search history.

(56) References Cited

U.S. PATENT DOCUMENTS

| | | | |
|---|---|---|---|
| 2010/0117070 A1* | 5/2010 | Adekore | H01L 21/0237 257/43 |
| 2014/0285998 A1* | 9/2014 | Yoon | C07F 9/12 362/84 |
| 2015/0308658 A1* | 10/2015 | Shin | B32B 27/00 362/84 |

* cited by examiner

*Primary Examiner* — Anne Hines
(74) *Attorney, Agent, or Firm* — Bacon & Thomas, PLLC (57) ABSTRACT

An optical sheet is disclosed in the present invention and comprises a substrate, a reflective layer and a plurality of pixels. The reflective layer is disposed on the substrate. The pixels are composed of several quantum dot fluorescent powders respectively and arrayed on the reflective layer. In addition, a method for manufacturing the above optical sheet, a light emitting diodes module and a display using the above optical sheet are also disclosed in the present invention.

1 Claim, 8 Drawing Sheets

OPTICAL SHEET, METHOD FOR MANUFACTURING THE SAME, LIGHT EMITTING DIODES MODULE AND DISPLAY USING THE SAME

BACKGROUND OF THE INVENTION

1. Field of the Invention

The present invention relates to an optical sheet, more particularly to an optical sheet by arraying several quantum dot fluorescent powders respectively on the reflective layer for increasing the light emitting efficiency, and the method manufacturing the same, light emitting diodes module and display using the same.

2. Description of the Prior Art

The typical lighting products normally use one or more incandescent lamps, although the incandescent lamp is cheap, but 90% of the energy is turned into the waste heat, only 10% of the energy is turned into the lighting. The efficiency is low and operation cost is quite high. In addition, the service life of the incandescent lam is very short.

As for the follow-up developed fluorescent lamp developing out in, although the efficiency is higher than the incandescent lamp, however, the material (such as mercury) is dangerous. In addition, the volume of fluorescent lamp is large and the cost is high, which is not suitable to be used in the small space, and the operation performance is poor under low temperature etc. Thus, although the service life of fluorescent lamp is longer than the incandescent lamp, the cost of the fluorescent lamp is higher than the incandescent lamp, and the fluorescent lamp needs the manpower for maintenance.

Thus, under the continuous advancement of technology, the Solid-State Lighting (SSL) has become an innovative lighting technology. It uses the light emitting diodes (LEDs), organic light emitting diode (OLED) or polymer (PLED) as the lighting source, in order to substitute the conventional incandescent lamp or fluorescent lamp.

Wherein, because the light emitting diode (LED) has the advantages of high illumination, small volume, light weight, uneasy to be damaged, low power consumption and long life etc., which is widely applied in the displaying products. Its light emitting principle is to utilize the combination of electrons and holes in the semiconductor, and the energy produced is released as light. The energy produced by the combination of electrons and holes is controlled by the energy level of material. When the energy level is larger, the wavelength of released light will be shorter. Thus, different material with different energy level can emit light with different wavelength. For example, the energy level of GaN is bout 3.39 eV. After the conversion, the wavelength is about 366 nm, which is the material for the emitting blue light. The appearance of the white light emitting diode extends the application of the light emitting diode to the illumination field. Upon comparing the white light emitting diode with the incandescent lamp and the fluorescent lamp, the light emitting diode has the advantages of low caloric value, low power consumption, long life, fast reaction and small volume etc., in which the power consumption is about ⅛ of the incandescent lamp, ½ of the fluorescent lamp, and the service life is more than 8,000 hours, which is 10 times of the fluorescent lamp.

At present, there are two kinds of ways to make the white light emitting diode mainly. One way is the single crystal light emitting diode way, namely utilizes the single light emitting diode crystal to match a variety of fluorescent powders to form white light. At present, the blue light emitting diode crystal and the yellow fluorescent powders are mainly utilized to obtain white light. The ultraviolet light emitting diode crystal is utilized to activate the blue, green and red fluorescent powders for mixing into white light. Another way is the multi-crystal light emitting diode way, namely encapsulates the red, green and blue crystals at the same time for mixing into white light. However, because the multi-crystal light emitting diode way needs to use several light emitting diode crystals, thus the cost is relatively high. In addition, because the driving voltage, luminous intensity, temperature characteristic and service life of every color crystal are different, so that not only the design and make are more difficult, but also after the use for a long time, the color coordinate is also easy to offset. Thus, the present development is relatively inclined to toward the single crystal light emitting diode.

In the methods used in the abovementioned light emitting diode, the simplest method is to use the blue light emitting diode crystal with yellow fluorescent powders for mixing into white light. Wherein, the Nichia Corporation used the yttrium aluminum garnet (YAG) to cover the blue GaN light emitting diode crystal firstly. Part of blue light emitted from the blue GaN light emitting diode is absorbed by the yttrium aluminum garnet to emit yellow light. The unabsorbed blue light is complemented with yellow light to form white light. However the preparation process of yttrium aluminum garnet in the present invention is much complicated, and the drawback is uneven light emitting often caused by uneven mixing.

In recent years, the development of quantum dots (QD) from novel light emitting material is very fast. The quantum dots are semiconductor nano-particles. The energy levels of the valence band and conduction band present discontinuity due to the influence of quantum confinement. The light emitting wavelength can be changed through adjusting the particle size of quantum dots. When the quantum dots are smaller, the light emitting color is approaching blue. When the quantum dots are larger, the light emitting color is approaching red. In addition, the quantum dots own excellent light absorbing-emitting characteristic, very narrow light emitting half-width, high efficiency and very wide absorption frequency. Thus, there is very high color purity and saturation degree. Through combining the abovementioned advantages, the quantum dots are considered as the potential white light emitting diode which can be used to replace current fluorescent powders.

However, the application of quantum dots on the technology developed for display has several drawbacks, such as uneven color and mutual color pollution etc.

SUMMARY OF THE INVENTION

In view of the aspect, the present invention provides an optical sheet, which comprises a substrate, a reflective layer and a plurality of pixels. The reflective layer is disposed on the substrate. The pixels are composed of several quantum dot fluorescent powders respectively and arrayed on the reflective layer.

In an embodiment of the present invention, wherein the abovementioned reflective layer is a Distributed Bragg Reflector.

In an embodiment of the present invention, wherein the abovementioned pixels comprise a first pixel, a second pixel and a third pixel. The first pixel comprises the first quantum dot fluorescent powders of peak wavelength inside red light. The second pixel comprises the second quantum dot fluorescent powders of peak wavelength inside green light. The third pixel comprises the third quantum dot fluorescent powders of peak wavelength inside blue light.

In an embodiment of the present invention, wherein the abovementioned pixels are made by a lithography process.

Another purpose of the present invention is to provide a manufacturing method for the abovementioned optical sheet, which comprises the following steps: Firstly, a reflective layer is formed on the substrate. Then, a plurality of pixels is formed on the reflective layer. Wherein, the pixels comprises several quantum dot fluorescent powders respectively and arrayed on the reflective layer.

In an embodiment of the present invention, wherein the reflective layer is a Distributed Bragg Reflector.

In an embodiment of the present invention, wherein the abovementioned pixels comprises a first pixel, a second pixel and a third pixel. The first pixel comprises the first quantum dot fluorescent powders of peak wavelength inside red light. The second pixel comprises the second quantum dot fluorescent powders of peak wavelength inside green light. The third pixel comprises the third quantum dot fluorescent powders of peak wavelength inside blue light. And preferably, the steps for disposing the abovementioned pixels on the reflective layer further comprise: Firstly, coating a first quantum dot fluorescent powders layer on the reflective layer, and patterning the first quantum dot fluorescent powders layer to form the first pixel. Then, coating a second quantum dot fluorescent powders layer to cover the reflective layer and the first pixel, and patterning the second quantum dot fluorescent powders layer to form the second pixel. Finally, coating a third quantum dot fluorescent powders layer to cover the reflective layer, the first pixel and the second pixel, and patterning the third quantum dot fluorescent powders layer to form the third pixel.

In an embodiment of the present invention, wherein the steps before disposing the abovementioned pixels on the reflective layer further comprise: Mixing the poly(methyl methacrylate) with the first quantum dot fluorescent powders, the second quantum dot fluorescent powders and the third quantum dot fluorescent powders, respectively.

Another purpose of the present invention is to provide a light emitting diodes module for the abovementioned optical sheet.

Another purpose of the present invention is to provide a display for the abovementioned optical sheet.

Figure 1:
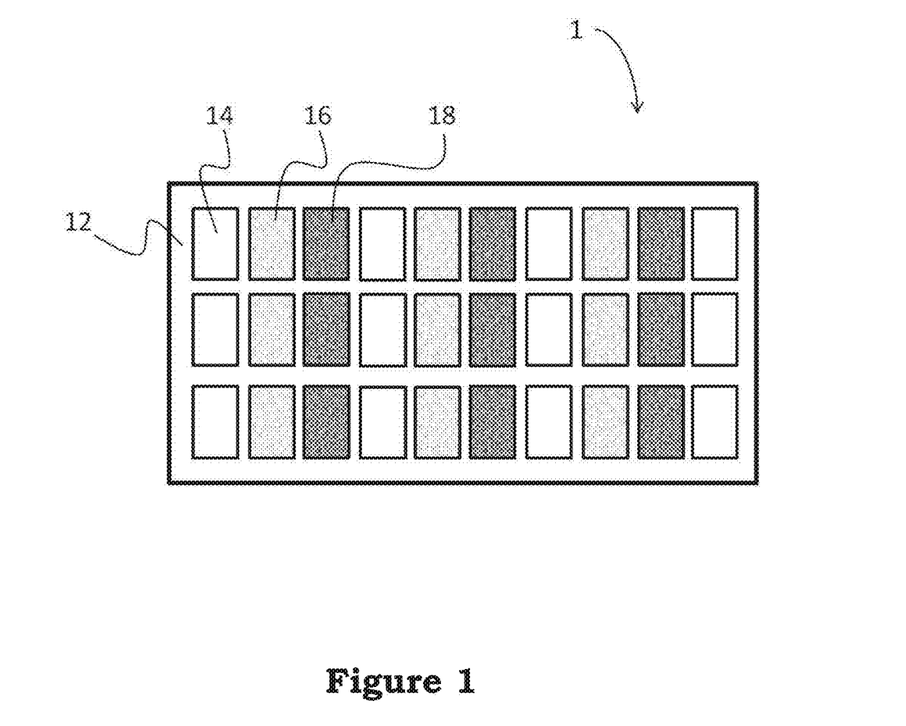
FIG. 1 illustrates the top view for an embodiment of the optical sheet in the present invention.
Figure 2A:
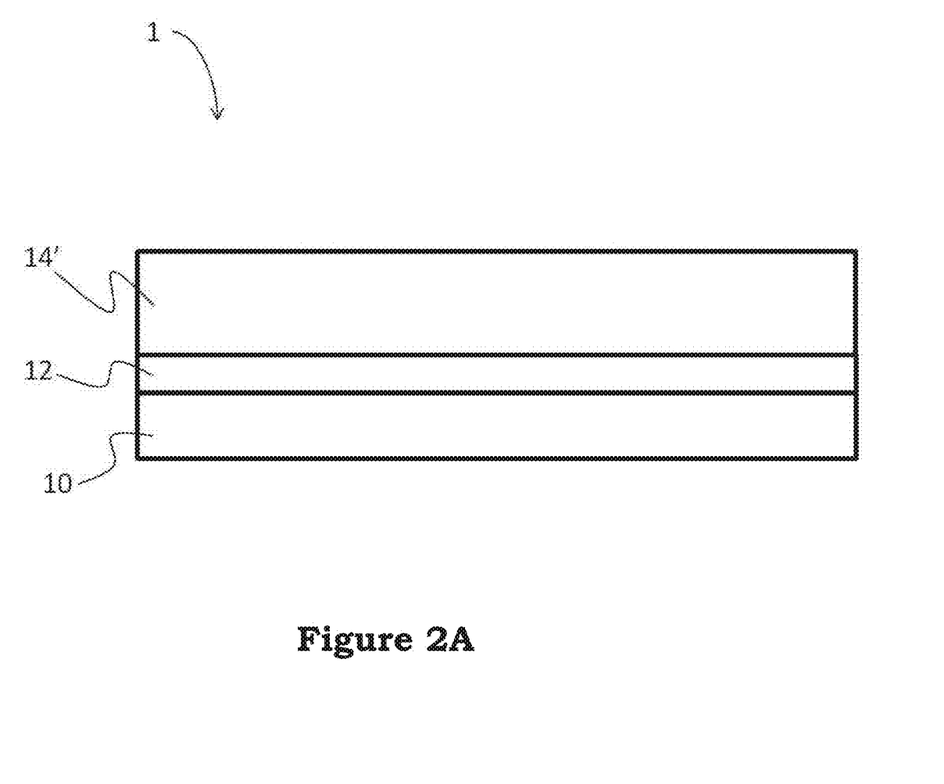
FIGS. 2A to 2F illustrate the cross-sectional view for the manufacturing process of an embodiment of the optical sheet in the present invention.
Figure 2B:
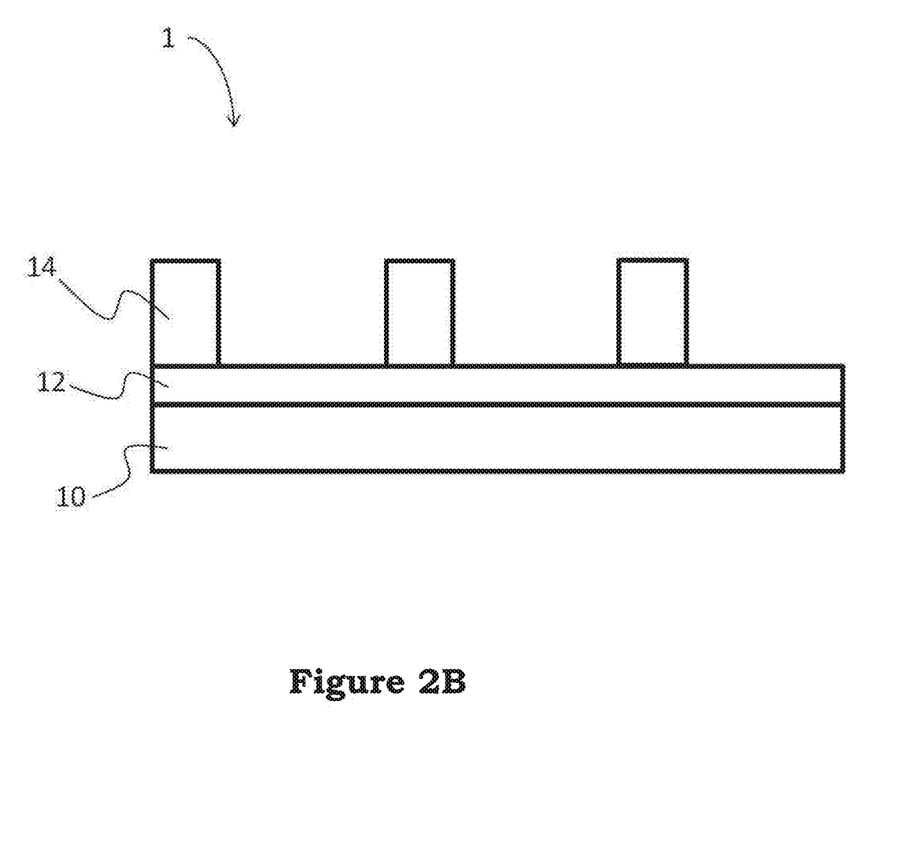
Figure 2C:
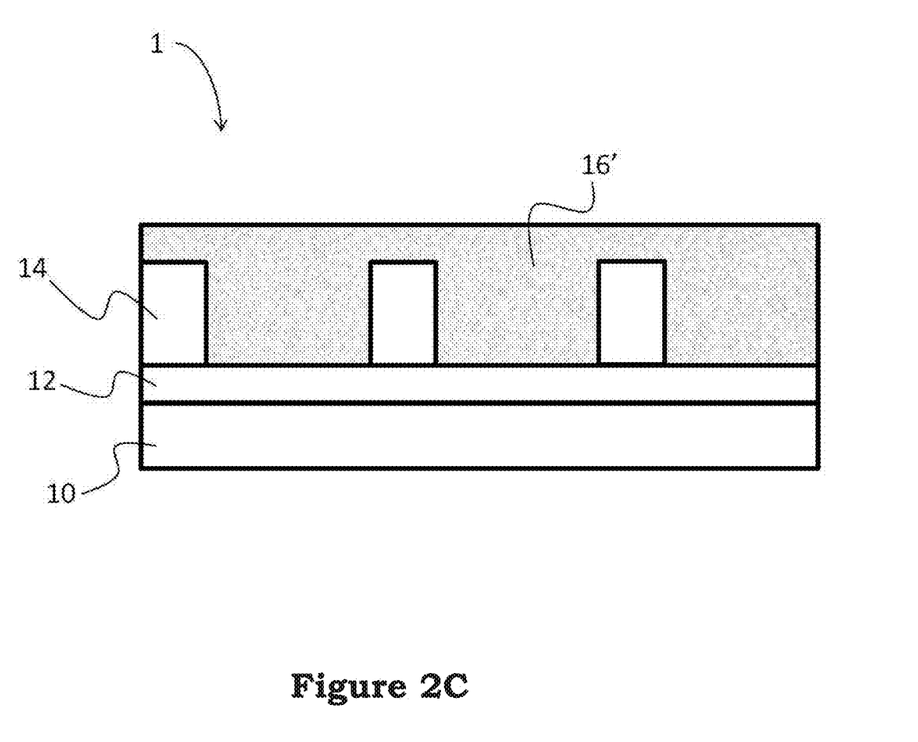
Figure 2D:
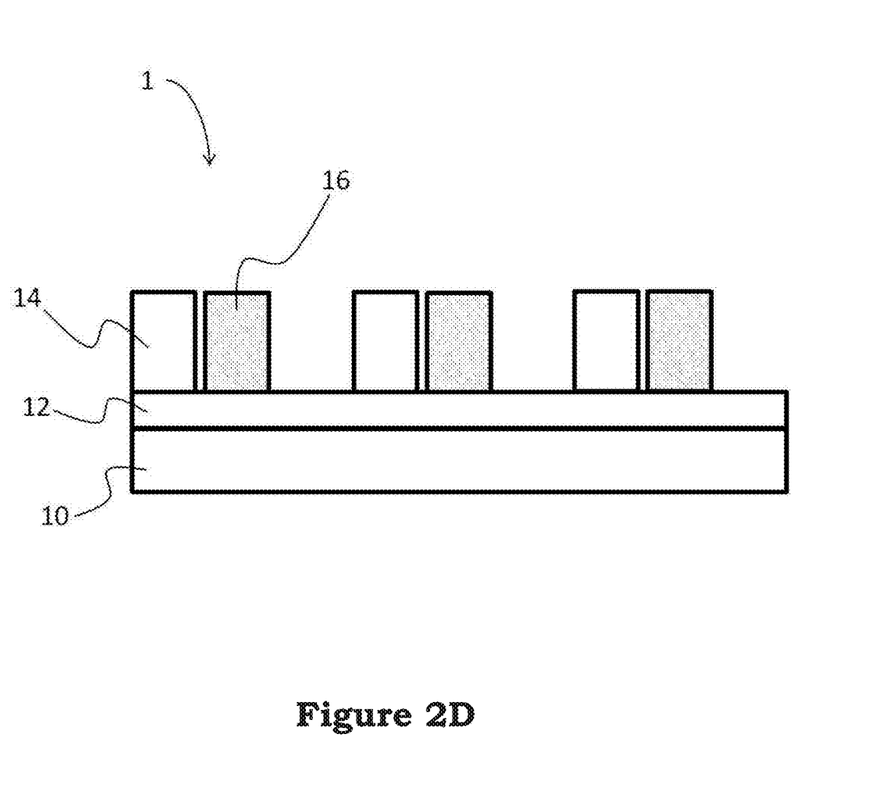
Figure 2E:
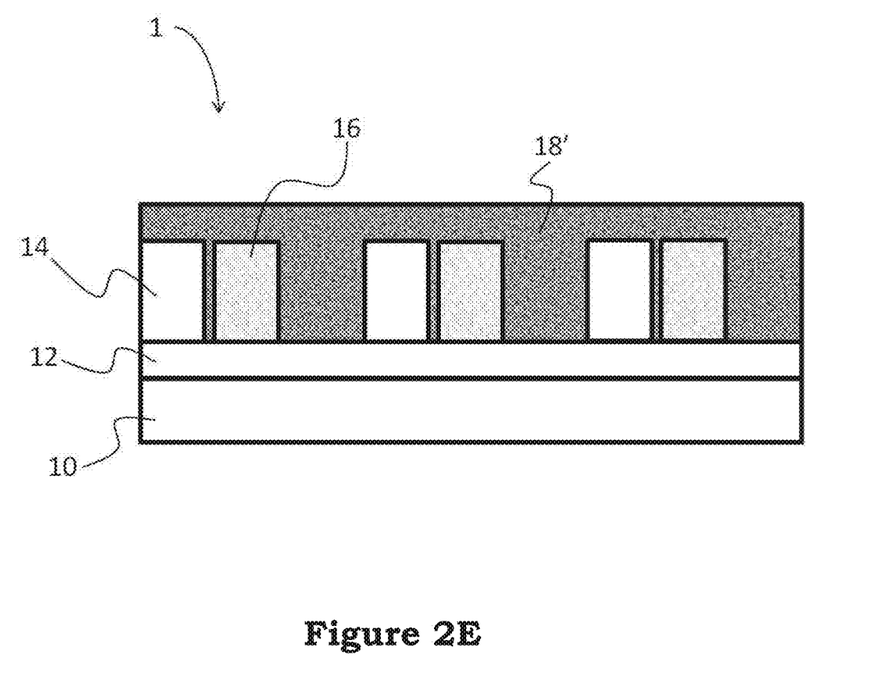
Figure 2F:
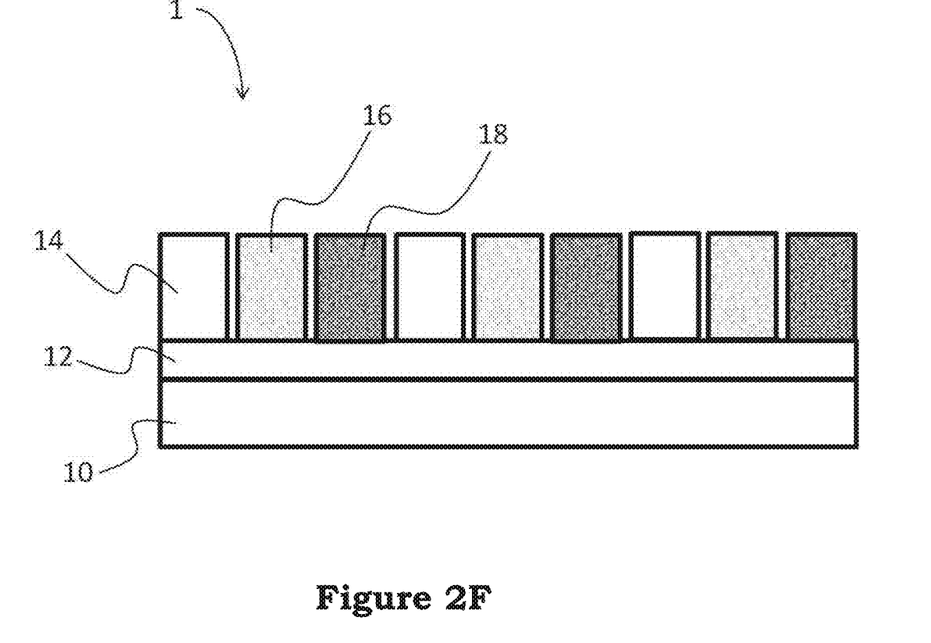
Figure 3:
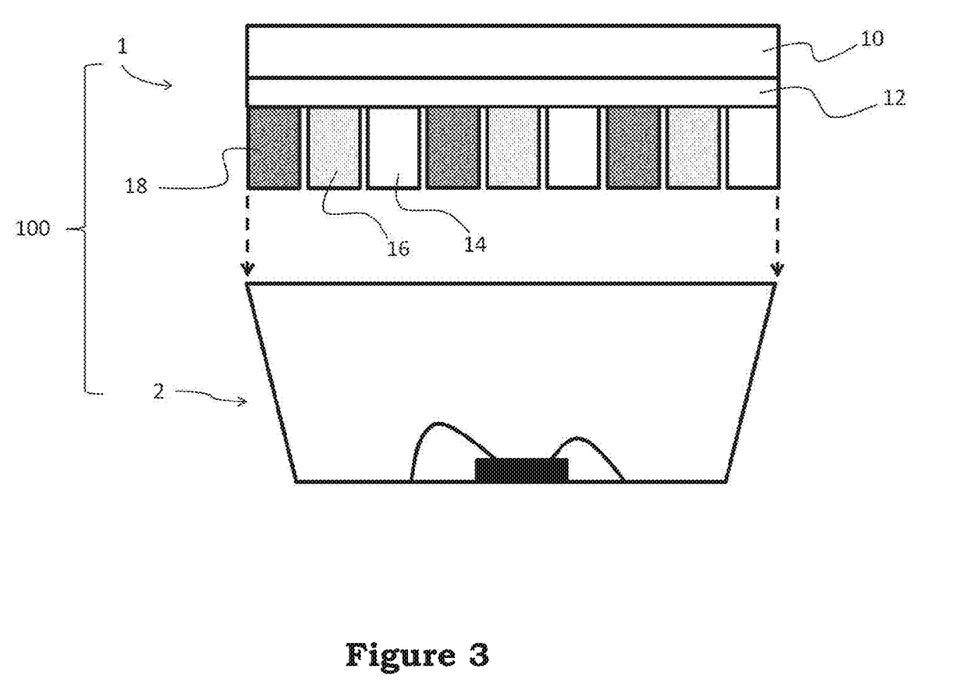
FIG. 3 illustrates the cross-sectional view for an embodiment of light emitting diodes module in the present invention.

Therefore, the features and advantages of the present invention can be understood further by the following description and attached FIGS. 1 to 3.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In the following description, the Figures will be used to describe the implementation way of the present invention. In the Figures, the same symbol represents the same component, and the size of component may be exaggerated for more clear description.

Firstly, please refer to FIG. 1. FIG. 1 illustrates the top view for an embodiment of the optical sheet in the present invention. As shown in FIG. 1, the present invention provides an optical sheet 1, which comprises a substrate (not shown in the Figure), a reflective layer 12 and a plurality of pixels.

Although not shown in the FIG. 1, the reflective layer 12 is disposed on the substrate. Moreover, the reflective layer 12 used in the present invention is a material with high reflectivity. Preferably, the reflective layer 12 is the Distributed Bragg Reflector (DBR). In a preferable embodiment, because the follow-up quantum dot fluorescent powders (red, green and blue) can be activated by about 365 nm light, the abovementioned Distributed Bragg Reflector can be laminated by the dielectric materials (such as silicon dioxide and hafnium dioxide), and more than 90% of ultraviolet can be reflected effectively.

These plurality of pixels comprise a plurality of first pixels 14, a plurality of second pixels 16 and a plurality of third pixels 18. As shown in FIG. 1, these first pixels 14 are arrayed in a row alternatively, and these second pixels 16 and these third pixels 18 are arrayed in the same way. Then, every row is separated by an interval. So as shown in the first row of FIG. 1, these pixels are arranged from left to right by the first pixel 14, the second pixel 16, the third pixel 18, the first pixel 14, the second pixel 16 etc. to form an array on the reflective layer 12. However, the category, quantity and arrangement of these pixels are described by a preferred embodiment, but the present invention is not limited by this embodiment.

Moreover, these pixels are composed of a plurality of quantum dot fluorescent powders. Furthermore, the first pixel 14 comprises the first quantum dot fluorescent powders of peak wavelength inside red light. The second pixel 16 comprises the second quantum dot fluorescent powders of peak wavelength inside green light. The third pixel 18 comprises the third quantum dot fluorescent powders of peak wavelength inside blue light. That is to say, that the first pixel 14, the second pixel 16 and the third pixel 18 represents red, green and blue quantum dot fluorescent powders, respectively. According to the arrangement way of FIG. 1, these pixels form three raw colors (red, green and blue) (RGB) of display.

In an embodiment of the present invention, these quantum dot fluorescent powders can be selected from silicon-based nanocrystal, II-VI Group compound semiconductor nanocrystal, III-V Group compound semiconductor nanocrystal, IV-VI Group compound semiconductor nanocrystal, or one of their combinations. Among them, the abovementioned II-VI Group compound semiconductor nanocrystal can be selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgZnSTe. The abovementioned III-V Group compound semiconductor nanocrystal can be selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs and InAlPAs. The abovementioned IV-VI Group compound semiconductor nanocrystal can be SbTe.

Then, please refer to FIGS. 2A to 2F. As shown in the Figures, the manufacturing process for the optical sheet provided by the present invention comprises the following steps: Firstly, as shown in FIG. 2A, a reflective layer 12 is disposed on the substrate 10. Preferably, the substrate 10 is a glass substrate, but this invention is not limited by this. The reflective layer 12 is a Distributed Bragg Reflector, which has been already been described in the preceding paragraphs and would not be described in detail again.

At this moment, mixing the poly(methyl methacrylate) with the first quantum dot fluorescent powders, the second quantum dot fluorescent powders and the third quantum dot fluorescent powders, respectively to prepare three different coating materials. Firstly, coating a first quantum dot fluorescent powders layer 14' on the reflective layer 12. Then, using the yellow lithography process to pattern the first quantum dot fluorescent powders layer 14', and using the etching process to define the position of the first pixel 14, as shown in FIG. 2B. The number and position of first pixel 14 shown in FIG. 2B are described by a preferred embodiment, but the present invention is not limited by this embodiment. It is to say that the first pixel 14 can be presented at any place of the reflective layer 12 individually, which depends on the required application in the future.

Please refer to FIG. 2C. After the first pixel 14 is finished, coating a second quantum dot fluorescent powders layer 16' on the reflective layer 12 completely. It is to say that the second quantum dot fluorescent powders layer 16' is disposed on the reflective layer 12 with the first pixel 14 and without the first pixel 14. Then, using the yellow lithography process to pattern the second quantum dot fluorescent powders layer 16' to define the second pixel 16, as shown in FIG. 2D. In a preferred embodiment, based on the follow-up application of display, the abovementioned pixels can be arrayed on the reflective layer. Thus, the second pixel 16 is placed by the first pixel 14 with an interval, but the present invention is not limited by this.

Then, please refer to FIG. 2E continuously. After the second pixel 16 is finished, coating a third quantum dot fluorescent powders layer 18' on the reflective layer 12 completely. It is to say that the third quantum dot fluorescent powders layer 18' is not only disposed on the first pixel 14 and the second pixel 16, but also disposed on the reflective layer 12 without the first pixel 14 and the second pixel 16. Then, using the yellow lithography process to pattern the third quantum dot fluorescent powders layer 18' to define the third pixel 18, as shown in FIG. 2F. In a preferred embodiment, based on the follow-up application of display, the abovementioned pixels can be arrayed on the reflective layer. Thus, the third pixel 18 is placed by the second pixel 16 with an interval, but the present invention is not limited by this. If more than three rows of pixels will be disposed on the reflective layer 12, the abovementioned coating and lithography processes should be repeated.

The structure and manufacturing method for the optical sheet of the present invention have already been described in the preceding paragraphs. The light emitting diodes module of the abovementioned optical sheet will be described in the preceding paragraphs. Please refer to FIG. 3. FIG. 3 illustrates the cross-sectional view for an embodiment of light emitting diodes module in the present invention. As shown in FIG. 3, the abovementioned optical sheet 1 can be placed at a light output direction of light emitting diode 2, so that the quantum dot fluorescent powders with red, green and blue colors can be activated. When the light reaches the reflective layer 12, the ultraviolet can be reflected effectively to activate more quantum dot fluorescent powders, in order to increase the light emitting efficiency of quantum dot fluorescent powders. Preferably, through matching the red, green and blue quantum dot fluorescent powders with ultraviolet light emitting diode, the device of the present invention can become a white light emitting diodes module. However, this is the description of possible application. The application for the optical sheet provided by the present invention is not limited to this. The abovementioned pixels array with quantum dot fluorescent powders can also be applied in the display.

Summarized from the abovementioned description, the present invention provides an optical sheet. The optical sheet uses the quantum dot fluorescent powders and the high reflective material (Distributed Bragg Reflector (DBR) is used in the present invention) to increase the reflection of ultraviolet and activate more quantum dots (such as red, green and blue quantum dots), so as to increase the illumination of these quantum dots. Meanwhile, the present invention uses the lithography process to convert the quantum dot fluorescent powders in to different color (the abovementioned red, green and blue) of pixels, which are arrayed on the abovementioned high reflective material. Except the distinguishability between homogeneity and color can be improved, the size of pixel can further be reduced to micron grade. Therefore, when the optical sheet provided by the present invention is employed in the light emitting diodes module or display, the display can get more remarkable color performance.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A manufacturing method for an optical sheet, comprising the following steps:
   forming a reflective layer on a substrate; and
   forming a plurality of pixels on the reflective layer, wherein the plurality of pixels are composed of a plurality of quantum dot fluorescent powders and arrayed on the reflective layer,
   coating a first quantum dot fluorescent powder layer on the reflective layer;
   patterning the first quantum dot fluorescent powder layer to form a first pixel;
   coating a second quantum dot fluorescent powder layer to cover the reflective layer and the first pixel;
   patterning the second quantum dot fluorescent powder layer to form a second pixel;
   coating a third quantum dot fluorescent powder layer to cover the reflective layer, the first pixel and the second pixel; and
   patterning the third quantum dot fluorescent powder layer to form a third pixel.

\* \* \* \* \*